United States Patent [19]
Pan

[11] Patent Number: 6,090,639
[45] Date of Patent: Jul. 18, 2000

[54] METHOD FOR FORMING A PHOTO DIODE AND A CMOS TRANSISTOR SIMULTANEOUSLY

[75] Inventor: Jui-Hsiang Pan, Hsin-Chu, Taiwan

[73] Assignee: United Microelectronics Corp., Hsin-Chu, Taiwan

[21] Appl. No.: 09/391,359

[22] Filed: Sep. 8, 1999

[51] Int. Cl.$^7$ .......................... H01L 21/00; H01L 31/062
[52] U.S. Cl. .................. 438/59; 438/57; 438/60; 438/73; 257/292; 257/462
[58] Field of Search ..................... 257/414, 444, 257/462, 446, 458, 233, 292; 438/48, 49, 57, 59, 60, 61, 73, 76, 78, 200

[56] References Cited

U.S. PATENT DOCUMENTS

| | | | |
|---|---|---|---|
| 5,319,225 | 6/1994 | Kim | 257/223 |
| 5,903,021 | 5/1999 | Lee et al. | 257/292 |
| 5,904,493 | 5/1999 | Lee et al. | 438/57 |
| 6,040,592 | 3/2000 | McDaniel et al. | 257/292 |
| 6,040,593 | 3/2000 | Park | 257/292 |

*Primary Examiner*—Donald L. Monin, Jr.
*Assistant Examiner*—Hoai Pham
*Attorney, Agent, or Firm*—Winston Hsu

[57] ABSTRACT

The present invention provides a method of simultaneously forming a photo diode and a CMOS transistor on a semiconductor wafer. The surface of the semiconductor wafer comprising a P-type substrate with at least one N-channel MOS area for forming a NMOS transistor of the CMOS transistor, and a photo sensing area for forming the photo diode. The method employs a first ion implantation process to form a P-type well in the NMOS area. Next, a second ion implantation process simultaneously forms a first N-type doped area in a predetermined area of the photo sensing area and a lightly doped drain of the NMOS transistor on the surface of the P-type well of the N-channel MOS area. Finally, a third ion implantation process forms a second N-type doped area in part of the surface of the photo sensing area, and forms the source and drain of the NMOS in the P-type well of the NMOS. The second N-type doped area and the first N-type doped area of the photo sensing area are at least partially overlapping.

8 Claims, 3 Drawing Sheets

METHOD FOR FORMING A PHOTO DIODE AND A CMOS TRANSISTOR SIMULTANEOUSLY

BACKGROUND OF THE INVENTION

1. Field of the invention

The present invention relates to a method for forming a photo diode on a semiconductor wafer, and more particularly, to a method for forming a photo diode and a CMOS transistor simultaneously.

2. Description of the prior art

The photo diode is a semiconductor device comprising a photo-conductivity cell and a junction diode, and is commonly applied to manufacture photoelectric products, such as cameras and photo sensors of scanners. The light current of the photo diode represents signals, the dark current represents noises, and the photo diode processes signal data by using the intensity of the signal to noise ratio. In the semiconductor industry, it is often to increase the light current of the photo diode so as to increase the signal to noise ratio, and hence to enhance the contrast of the signal. As a result, the sensitivity of the photo diode is enhanced and the quality of the photo diode is improved.

Please refer to FIG. 1, FIG. 1 is a schematic diagram of a photo diode 10 according to the prior art. A prior art photo diode 10 comprises a P-type well 16 positioned in a predetermined region on the semiconductor substrate 14, and a photo sensing area 12 formed on the surface of the P-type well 16. The semiconductor wafer further comprises a field oxide 18 surrounding the photo sensing area 12 on the semiconductor substrate 14 to form an electrical isolation to prevent short circuits.

The method of forming the photo diode 10 according to the prior art uses high dosage arsenic (As) atoms as the major dopant to proceed an ion implantation process. The energy and the dosage for the ion implantation process is 80 KeV and $10^5$ cm$^{-2}$, respectively. This ion implantation process forms a N-type doped area 13 on the surface of the P-type well 16. A depletion region 15 for detecting the light current is formed along the PN junction between the doped area 13 and the adjacent P-type well 16. In FIG. 1, the area labelled by slanting lines illustrates the depletion region 15.

In the formation of the photo diode 10 according to the prior art, As atoms at high dosage for forming the source and the drain of the MOS transistor are used as the major dopant to simultaneously form the doped area 13 on the surface of the P-type well 16. Therefore, the crystal structure on the surface of the photo sensing area 12 may be damaged by high dosage ions during the ion implantation. As a result, the PN junction of the photo diode 10 generates more dark current, resulting in higher noises of the photo diode 10. Also, the width of the depletion region 15 is narrower, resulting in a smaller real active region of the sensing area 12. Therefore, when light irradiates the photo diode 10, the light current sensed by the depletion region 15 is reduced and the signal to noise ratio is lowered. And hence, the sensitivity of the photo diode 10 is reduced.

In addition, using a higher implantation energy results in a deeper PN junction. When the photo diode 10 is irradiated by short wavelength lights, the blue light for instance, the light current induced by the PN junction of the photo diode 10 is smaller because the short wavelength light has a shallow penetration depth in the silicon wafer. Therefore, the sensitivity of the photo diode 10 for detecting the short wavelength light is reduced.

SUMMARY OF THE INVENTION

It is therefore a primary objective of the present invention to provide a method for simultaneously forming a photo diode and a CMOS transistor on a semiconductor wafer to solve the above mentioned problems.

In a preferred embodiment, the present invention provides a method for forming a photo diode and a CMOS transistor simultaneously. The surface of the semiconductor wafer comprising a P-type substrate with at least one N-channel MOS area for forming a NMOS transistor of the CMOS transistor, and a photo sensing area for forming the photo diode, the method comprising the following steps:

performing a first ion implantation process to form a P-type well of the NMOS transistor in the N-channel MOS area;

performing a second ion implantation process to simultaneously form a first N-type doped area in a predetermined area of the photo sensing area and a lightly doped drain (LDD) on the surface of the P-type well of the N-channel MOS area; and performing a third ion implantation process to form a second N-type doped area in part of the surface of the photo sensing area and to form the source and drain of the NMOS in the P-type well of the N-channel MOS area;

wherein the second N-type doped area and the first N-type doped area of the photo sensing area are at least partially overlapping.

It is an advantage of the present invention that the method can simultaneously form a photo diode and a CMOS transistor to simplify the semiconductor process and reduce the processing cost, and to enhance the sensitivity of the photo diode.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
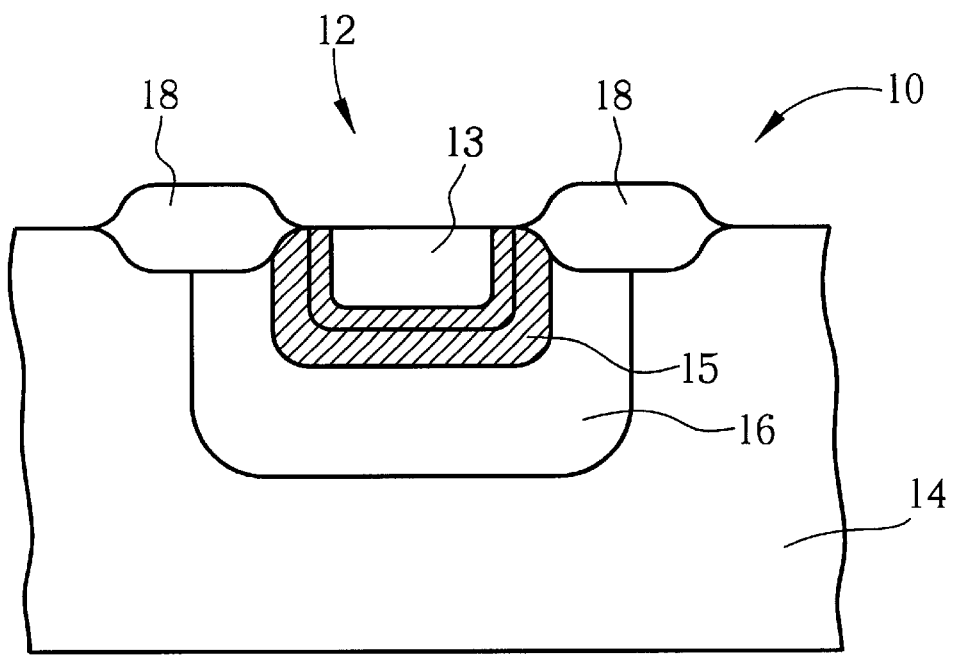
FIG. 1 is a schematic diagram of a photo diode according to the prior art.

Please refer to FIG. 2 through FIG. 5, FIG. 2 through FIG. 5 are schematic diagrams of a method for forming a photo diode 50 according to the present invention. The present invention is a method of simultaneously forming a photo diode 50 and a CMOS transistor on a semiconductor wafer 20. The photo diode 50 is formed on the surface of the semiconductor wafer 20. The semiconductor wafer 20 comprises a P-type substrate 22, a N-channel MOS (NMOS) area 24 positioned on the surface of the P-type substrate 22 for forming a NMOS transistor of the CMOS transistor, and a photo sensing area 26 positioned on the surface of the P-type substrate 22 for forming the photo diode 50. The P-type substrate 22 comprises a heavily doped P-type silicon substrate layer and a lightly doped epitaxy layer on the P-type silicon substrate layer wherein the photo diode 50 and the CMOS transistor are all formed in the epitaxy layer. The P-type substrate 22 may be made of an uniform P-type silicon material. The semiconductor wafer 20 further comprises a silicon nitride layer 28 and a photoresist layer 30 with a predetermined pattern to define the regions of the NMOS area 24 and the photo sensing area 26.

Figure 2:
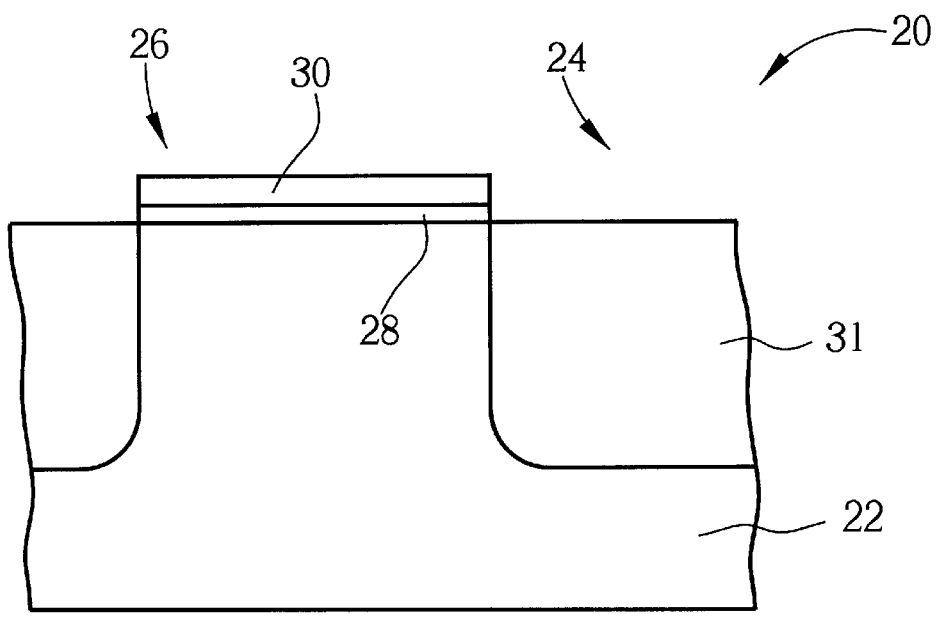
FIG. 2 though FIG. 5 are schematic diagrams of a method for forming a photo diode according to the present invention.
Figure 3:
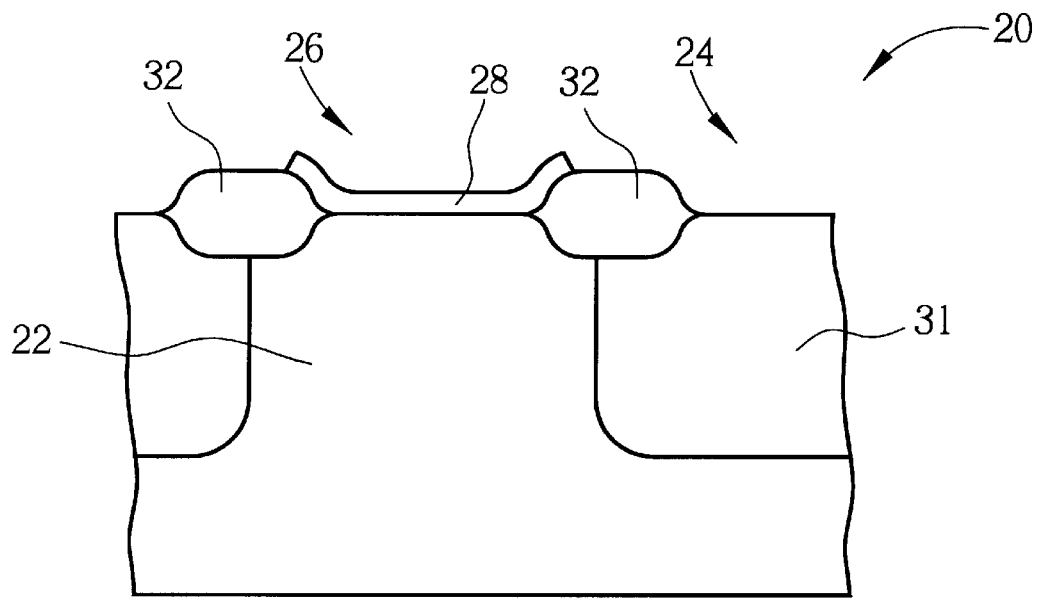

As shown in FIG. 2, the method for forming the photo diode 50 according to the present invention begins with a first ion implantation process on the semiconductor wafer 20 to form a P-type well 31 in the NMOS area 24. Then, as shown in FIG. 3, a photoresist stripping process is employed to completely remove the photoresist layer 30 from the semiconductor wafer 20. A thermal oxidation process is employed to form a field oxide 32 in the area not covered by the silicon nitride layer 28. The field oxide 32 serves as a electrical isolation to prevent short circuits.

Figure 4:
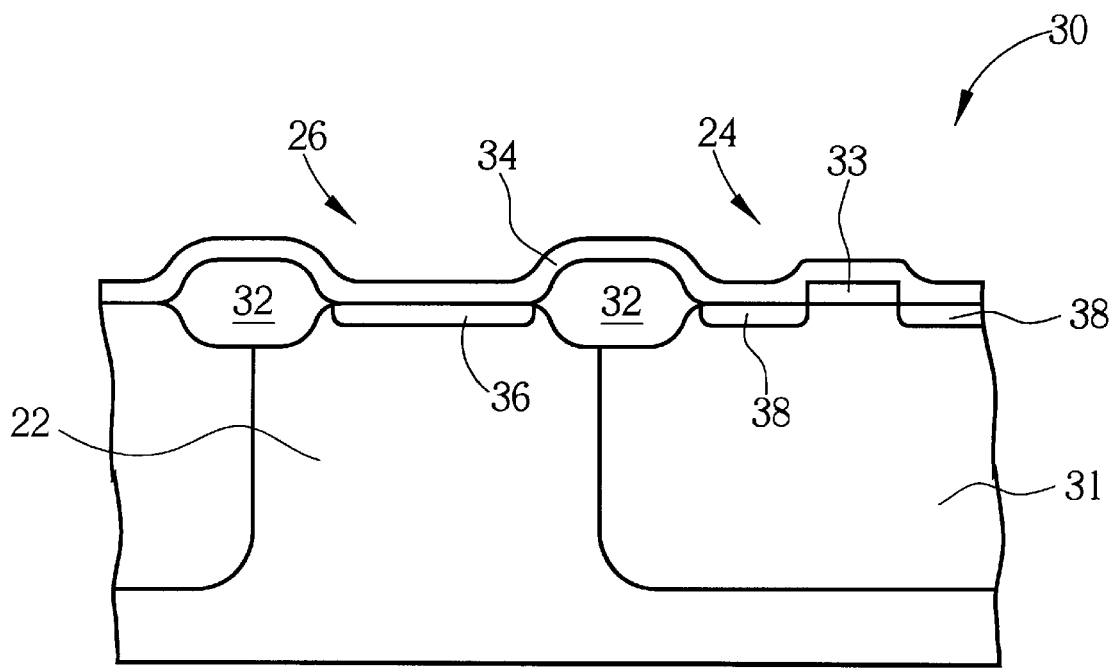

As shown in FIG. 4, after forming the field oxide 32, a stripping process is employed to remove the silicon nitride layer 28, and a gate 33 of the NMOS transistor is subsequently formed. Then, a second ion implantation process using phosphorus atoms ($p^{31}$) as implants is performed to form a first N-type doped area 36 in a predetermined area of the photo sensing area and a lightly doped drain (LDD) 38 on the surface of the P-type well 31 of the N-channel MOS area 24. Then, an atmospheric pressure chemical vapor deposition (APCVD) process introducing $O_3$ and TEOS gases is performed at 100~400° C. to form an $O_3$/TEOS oxide layer 34 on the semiconductor wafer 20.

Figure 5:
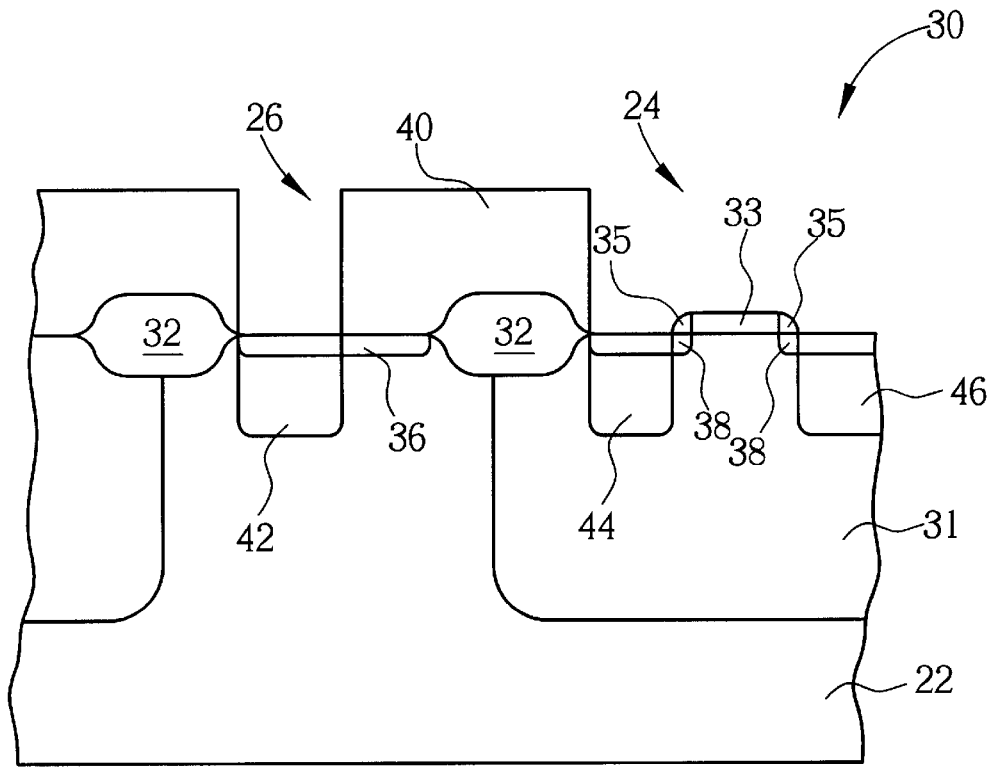

As shown in FIG. 5, an etching process is performed to etch back the $O_3$/TEOS oxide layer 34 and form a spacer 35 around the sidewall of the gate 33 of the NMOS transistor. Next, a lithography process is performed to form a photoresist layer 40 with a predetermined pattern on the semiconductor wafer 20. Finally, a third ion implantation process is performed to implant As atoms into the surface of the P-type substrate 22. The dosage for the third ion implantation process is higher than that for the second ion implantation process. The third ion implantation process forms a deep second N-type doped area 42 in part of the surface of the photo sensing area 26, and the second N-type doped area 42 and the first N-type doped area 36 are partially overlapping to complete the formation of the photo diode 50. During the third ion implantation process, the source 44 and drain 46 of the NMOS transistor are also formed in the P-type well 31 of the N-channel MOS area.

Figure 6:
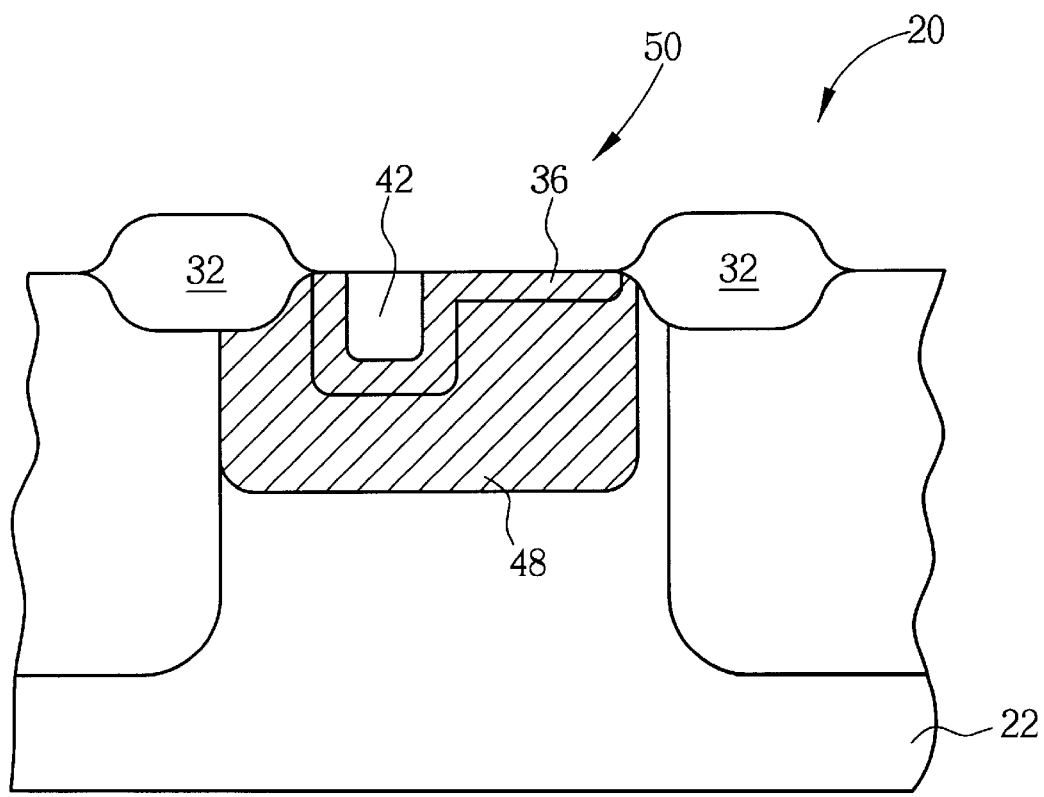
FIG. 6 is a schematic diagram of the photo diode according to the present invention.

Please refer to FIG. 6, FIG. 6 is a schematic diagram of the photo diode 50 according to the present invention. The photo diode 50 is formed on the surface of the P-type substrate 22 of the semiconductor wafer 20, and is surrounded by the field oxide 32 to be electrically isolated from other semiconductor devices to prevent short circuits. The photo diode 50 comprises the first N-type doped area 36 with a shallow depth, the second N-type doped area 42 with a deep depth, and a depletion region 48 formed along the PN junction between the first N-type doped areas 36 and the second N-type doped areas 42. The thickness of the first N-type doped area 36 is less than 0.25 μm, and the first N-type doped area 36 contains a phosphorus atom density of less than $10^{18}$ cm$^{-3}$. The second N-type doped area 42 is thicker than 0.25 μm. In FIG. 6, the area labelled by slanting lines illustrates the depletion region 48.

Because the thickness of the first N-type doped area formed on the surface of the P-type substrate is less than 0.25 μm, the depletion region formed by the first N-type doped area and the P-type substrate is very close to the surface of the semiconductor wafer. Hence, the photo diode can effectively detect the short wavelength light with a shallow penetration depth, such as blue light. The phosphorus atom density in the first N-type doped area is less than $10^{18}$ cm$^{-3}$, so the width of the depletion region can be expended and the sensitivity of the photo diode for detecting blue light can be enhanced. The method according the present invention uses As atoms at a high dosage as the major dopant to proceed the third ion implantation process, therefore, the second N-type doped area formed on the surface of the P-type substrate is larger in its thickness (the average thickness is more than 0.25 μm). Also, the thickness of second N-type doped area is approximately the same as that of the the photo sensing area of the prior art photo diode. Therefore, the second N-type doped area can detect a large proportion of lights when red light is the main light source.

In addition, in the photo diode 50 according to the resent invention, the photo sensing area 26 comprises the first N-type doped area formed under lower implantation energy and the second N-type doped area formed under higher implantation energy. It is quite different from the photo sensing area 12 of the prior art photo diode 10 which is formed by only one ion implantation with high dosage of ions. The present invention effectively prevents the damages of the crystal structure on the surface of the photo sensing area, and increases the width of the depletion region to expend the real active region of the photo sensing area. As a result, the present invention enhances the intensity of the light current and increases the signal to noise ratio of the photo diode.

In contrast to the prior art method of forming the photo diode, the method according to the present invention forms the photo diode and the CMOS transistor on the semiconductor wafer simultaneously to simplify the fabrication processes and reduce the processing costs. The photo diode according to the present invention comprises two doped areas of different thicknesses to detect lights with different penetration depths, so as to enhances the sensitivity of the photo diode and prevent the damages of the crystal structure on the surface of the photo sensing area.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of simultaneously forming a photo diode and a CMOS transistor on a semiconductor wafer, the surface of the semiconductor wafer comprising a P-type substrate with at least one N-channel MOS area for forming a NMOS transistor of the CMOS transistor, and a photo sensing area for forming the photo diode, the method comprising the following steps:

performing a first ion implantation process to form a P-type well of the NMOS transistor in the N-channel MOS area;

performing a second ion implantation process to simultaneously form a first N-type doped area in a predetermined area of the photo sensing area and a lightly doped drain (LDD) on the surface of the P-type well of the N-channel MOS area; and performing a third ion implantation process to form a second N-type doped area in part of the surface of the photo sensing area and to form the source and drain of the NMOS in the P-type well of the N-channel MOS area;

wherein the second N-type doped area and the first N-type doped area of the photo sensing area are at least partially overlapping.

2. The method of claim 1 wherein the first ion implantation process will also form a P-type well in the photo sensing area and the first and second N-type doped areas are formed on the surface of the P-type well of the photo sensing area.

3. The method of claim 1 wherein the P-type substrate comprises a heavily doped P-type silicon substrate layer and a lightly doped epitaxy layer on the P-type silicon substrate layer wherein the photo diode and the CMOS transistor are all formed in the epitaxy layer.

4. The method of claim 1 wherein phosphorus atoms ($P^{31}$) are used as implants in the second ion implantation process.

5. The method of claim 4 wherein the thickness of the first N-type doped area is less than 0.25 $\mu$m and contains a phosphorus atom density of less than $10^{18}$ cm$^{-3}$.

6. The method of claim 1 wherein As atoms are used as implants in the third ion implantation process.

7. The method of claim 6 wherein a larger quantity of implants is used during the third ion implantation process than during the second ion implantation process and the second N-type doped area is thicker than 0.25 $\mu$m.

8. The method of claim 1 wherein the lightly doped N-type dopants in the first N-type doped area interacts with the P-type substrate to form a wider depletion region so as to enhance the blue light sensitivity of the photo diode.

* * * * *